United States Patent
Kobayashi et al.

(10) Patent No.: US 7,148,767 B2
(45) Date of Patent: *Dec. 12, 2006

(54) BEAD TYPE NOISE FILTER

(75) Inventors: Osamu Kobayashi, Iwata-gun (JP); Osamu Yamada, Iwata-gun (JP); Yukio Suzuki, Iwata-gun (JP); Kiyoshi Ito, Iwata-gun (JP); Mayuka Shirai, Iwata-gun (JP)

(73) Assignee: Minebea Co., Ltd., Kitasaku (JP)

( * ) Notice: Subject to any disclaimer, the term of this patent is extended or adjusted under 35 U.S.C. 154(b) by 41 days.

This patent is subject to a terminal disclaimer.

(21) Appl. No.: 10/515,494

(22) PCT Filed: Sep. 22, 2003

(86) PCT No.: PCT/JP03/12044

§ 371 (c)(1),
(2), (4) Date: Nov. 24, 2004

(87) PCT Pub. No.: WO2005/029517

PCT Pub. Date: Mar. 31, 2005

(65) Prior Publication Data

US 2006/0055487 A1 Mar. 16, 2006

(51) Int. Cl.
*H03H 7/00* (2006.01)
*H01F 27/24* (2006.01)
*C04B 35/26* (2006.01)

(52) U.S. Cl. .................... 333/181; 252/62.62; 336/233

(58) Field of Classification Search .............. 333/12, 333/181; 336/233; 252/62.62, 62.57, 62.58
See application file for complete search history.

(56) References Cited

U.S. PATENT DOCUMENTS

| | | | | |
|---|---|---|---|---|
| 4,146,854 A | * | 3/1979 | Ishino et al. | 333/81 R |
| 4,656,451 A | * | 4/1987 | Pomponio | 336/96 |
| 5,455,552 A | * | 10/1995 | Metsler | 336/65 |
| 5,500,629 A | * | 3/1996 | Meyer | 333/181 |
| 6,180,022 B1 | | 1/2001 | Kobayashi et al. | |
| 6,210,598 B1 | | 4/2001 | Kobayashi et al. | |
| 6,798,329 B1 | * | 9/2004 | Kobayashi et al. | 336/233 |
| 2002/0096665 A1 | * | 7/2002 | Kobayashi et al. | 252/500 |

FOREIGN PATENT DOCUMENTS

| | | |
|---|---|---|
| EP | 0 980 856 A1 | 2/2000 |
| EP | 0 980 857 A1 | 2/2000 |
| EP | 1138649 A2 * | 10/2001 |
| EP | 1283529 A2 * | 2/2003 |
| EP | 1286366 A2 * | 2/2003 |
| JP | A 64-41202 | 2/1989 |

(Continued)

*Primary Examiner*—Seungsook Ham
(74) *Attorney, Agent, or Firm*—Oliff & Berridge, PLC

(57) ABSTRACT

A bead type noise filter according to the present invention is constituted by a magnetic core 1 formed of Mn—Zn ferrite having its resistivity increased so as to improve a high frequency characteristic, and having its permittivity lowered, and thereby can successfully suppress radiation noises without distorting the waveform of transmission signals. The magnetic core 1 constituting the bead type noise filter is formed of a high resistivity soft magnetic material, is shaped cylindrical, and has at least one through-hole 1a so as to form a closed magnetic path, and the bead type noise filter is attached on a signal line 2 such that the signal line 2 is inserted through the through-hole 1a. The soft magnetic material has a real part of complex relative permittivity ranging from 1,000 up to 20,000 at 1 kHz and 50 or lower at 1 MHz, and has a resistivity of 150 Ωm or higher.

3 Claims, 4 Drawing Sheets

FOREIGN PATENT DOCUMENTS

| | | |
|---|---|---|
| JP | A 5-283223 | 10/1993 |
| JP | 08181478 A * | 7/1996 |
| JP | B2 3108803 | 9/2000 |
| JP | B2 3108804 | 9/2000 |
| JP | A 2003-282318 | 10/2003 |
| JP | A 2003-324014 | 11/2003 |

* cited by examiner

BEAD TYPE NOISE FILTER

TECHNICAL FIELD

The present invention relates to a bead type noise filter which is used on a signal wire (signal line) and a power wire (DC line, and the like) mounted on a circuit board, and which suppresses unwanted radiation noises.

BACKGROUND ART

While electronic devices are coming out with reduced dimension and enhanced performance, high frequency noises radiated from a signal wire and a power wire (hereinafter referred to generically as "signal line") are becoming a major problem. These noises can be suppressed most simply by inserting the signal line through a closed magnetic path core called "bead core" shaped toroidal or cylindrical. Practically, the signal line is often inserted through the core with one turn therearound (one turn insertion), and in some cases, the core may be provided with a plurality of through-holes, through which the signal line is inserted for a plurality of turns therearound.

A bead type noise filter, which leverages the noise suppressing method described above, will hereinafter be explained with reference to FIG. 1. FIG. 1 shows a closed path magnetic core (bead core) 1 formed of a soft magnetic material having a high resistivity. The magnetic core 1 is shaped cylindrical, has a through-hole 1a along its center axis, and is attached on a signal line 2 such that the signal line 2 is inserted through the through-hole 1a, thereby functioning as a bead type noise filter. In this connection, the magnetic core 1 may alternatively be provided with a plurality of through-holes 1a (refer to FIG. 2).

In order to suppress unwanted radiation noises of several ten to several hundred MHz, the magnetic core 1 has been conventionally formed of Ni—Zn ferrite which has a high resistivity ($10^2$ to $10^5$ Ωm) so as to duly work in such a high frequency band. Also, the magnetic core 1 is required to have a high resistivity so as to keep away from troubles even when the signal line 2 inserted through the through-hole 1a is not provided with an insulating coat thus possibly making direct contact therewith, which is another reason for using Ni—Zn for the magnetic core 1. The usage of Ni—Zn ferrite containing en expensive material of Ni pushes up the cost of the bead type noise filter in spite of its simple structure.

On the other hand, conventional general Mn—Zn ferrite is an inexpensive soft ferrite but has a resistivity measuring as low as $10^{-1}$ to $10^0$ Ωm. Consequently, the magnetic core 1 formed of Mn—Zn ferrite cannot be used in a high frequency band, because eddy current loss increases strikingly in a frequency band lower than a signal frequency band where noises are required to be suppressed. Also, there is another problem with Mn—Zn ferrite that the signal line 2 without an insulating coat must not be disposed in direct contact with the magnetic core 1 when inserted through the through-hole 1a.

Mg—Zn ferrite is another inexpensive soft ferrite. Mg—Zn ferrite, however, is inferior to other soft ferrites in soft magnetic properties, such as initial permeability and saturation magnetic flux density, and so the magnetic core 1, when formed of Mg—Zn ferrite, must have an increased dimension in order to achieve equivalent characteristics as a bead type noise filter. Especially, when used to suppress noises in the signal line 2 (here, particularly a power wire) where ripple surge and surge noise present a problem, the magnetic core 1 must have its dimension further increased for prevention of magnetic saturation. Consequently, Mg—Zn ferrite is not used as a bead type noise filter.

Referring to FIG. 3, an equivalent circuit of a bead type noise filter is represented as a parallel circuit consisting of a series circuit of an inductance L component and a resistance R component, and a capacitance component C. Hereinafter, the inductance L component, the resistance R component, and the capacitance C component may be referred to simply as L component, R component, and C component, respectively, as appropriate.

In FIG. 3, in a frequency band of a signal to be transmitted (signal frequency band), there is a relation of: L>>R, where L=value of the L component, and R=value of the R component, each representing impedance |Z| value. Hence, the series circuit of the L and R components in the bead type noise filter functions as inductance (almost L component only), and the signal to be transmitted does not incur a loss caused due to the R component. Thus, the bead type noise filter, in conjunction with the C component at the signal line, constitutes a low-pass filter in terms of a circuit. But, since the value of the L component is small, and since a cutoff frequency is higher than a frequency band of the signal to be transmitted, the transmission loss of the signal can be ignored.

In a frequency band higher than the frequency band of a signal to be transmitted, there is a relation of L<<R, so the series circuit of the L and R components functions as resistance (almost R component only), and absorbs noises as heat. This contributes to effectively suppressing, in particular, unwanted radiation noises.

The impedance |Z| of the bead type noise filter can be split into a reactance X component (hereinafter referred to simply as X component, as appropriate) and a resistance R component as follows:

$$|Z|=\sqrt{(X^2+R^2)} \qquad \text{Formula (1)}$$

When, an AC magnetic field is applied to the magnet core of the bead type noise filter, its complex permeability μ can be represented as follows:

$$\mu=\sqrt{(\mu'^2+\mu''^2)} \qquad \text{Formula (2)}$$

where μ' is a real part, and μ" is an imaginary part. The X component of the bead type noise filter (the component may be "L component") is generated by the real part μ' while the R component thereof is generated by the imaginary part μ".

Consequently, the X component is dominant in a frequency band of the signal to be transmitted, which means that the bead type noise filter, in conjunction with the C component at the signal line, functions as a low-pass filter, and blocks passage of noise components superposed on the signal. However, the noise components blocked and prevented from passing may possibly affect other circuits. On the other hand, in a high frequency band where radiation noises are generated, the R component is dominant and converts noise components including the radiation noises into thermal energy, which constitutes a noise removing factor. Noises can be removed more safely and reliably when converted into thermal energy than when blocked by a low-pass filter.

A frequency at which the X and R components have an equal value, namely an X-R cross point, is a marginal frequency where dominance changes over between the X component to reflect noises and the R component to convert noises into thermal energy. Generally, the more the R component to convert noises into thermal energy is, the better it is in terms of removing noises, so a lower X-R cross point is more preferred if impedance characteristic is equal.

And, if the X component is large and the R component is small in a high frequency band, an LC resonance with a large Q (index to show inductance performance) is generated by the capacitance C component at the signal line, whereby a digital signal inputted may suffer waveform distortion, such as ringing, depending on a circuit to which the bead type noise filter is connected. Consequently, in a high frequency band, the smaller the X component is, the better it is.

In connection with the above-described relation between a frequency (band) and X and R components, the X-R cross point of a bead type noise filter constituted by a magnetic core formed of the aforementioned Ni—Zn ferrite is found approximately at 10 MHz which belongs to a high frequency band, and its reactance X component still keeps increasing in a high frequency band. So, if such a bead type noise filter using Ni—Zn ferrite is attached on an input signal line of a high impedance digital circuit having a capacitance of several pF, such as a C-MOS inverter, digital signals inputted suffer waveform distortion, such as ringing, undershoot, and overshoot. This is caused due to the generation of the above-described LC resonance having a comparatively large Q. For the reason of this waveform distortion as well as the aforementioned expensiveness of Ni—Zn ferrite, a bead type noise filter with a magnetic core formed of non-Ni—Zn ferrite has been demanded. Especially, a bead type noise filter which has a lower X-R cross point than one with a magnetic core formed of Ni—Zn ferrite, and which suppresses noises mainly by means of an R component in a safe and reliable manner is demanded.

The present invention has been made in light of the demand described above, and it is an object of the present invention to provide an inexpensive bead type noise filter which suppresses noises without distorting the waveform of a transmission signal, such as a digital signal, in order to deal with higher frequency and digitalization of signals in recent electronic devices.

Specifically, the object of the present invention (according to Claim 1) is to provide a bead type noise filter with a magnetic core formed of inexpensive Mn—Zn ferrite which has its resistivity significantly increased so as to achieve soft magnetic properties comparable to those of Ni—Zn ferrite in a high frequency band for the purpose of suppressing radiation noises of several 10 to several 100 MHz, also to provide an inexpensive bead type noise filter which allows a signal wire or power wire without an insulating coat to be inserted therethrough in a direct contact manner if needed. Further, the object of the present invention (according to Claims 2 and 3) is to eventually provide a high-performance bead type noise filter which, on top of accomplishing the above object, suppresses noises mainly by means of an R component in a safe and reliable manner so as not to distort the waveform of transmission signals.

DISCLOSURE OF INVENTION

According to Claim 1 of the present invention, in a bead type noise filter which comprises a magnetic core having a through-hole so as to form a closed magnetic path, and which is attached on one of a signal wire and a power wire such that the wire passes through the closed magnetic path of the magnetic core, the magnetic core is formed of a soft magnetic material which has a real part of complex relative permittivity ranging from 1,000 up to 20,000 at 1 kHz, and 50 or lower at 1 MHz, and which has a resistivity of 150 Ωm or higher. Consequently, the bead type noise filter can be fabricated inexpensively while it is provided with a significantly high resistivity and at the same time achieves a soft magnetic property comparable with that of Ni—Zn ferrite in a high frequency band thus enabling suppression of radiation noises of several ten to several hundred MHz.

According to Claim 2 of the present invention, the magnetic core is formed of Mn—Zn ferrite which has a basic component composition comprising: 44.0 to 50.0 (50.0 excluded) mol % $Fe_2O_3$; 4.0 to 26.5 mol % ZnO; 0.1 to 8.0 mol % at least one of $TiO_2$ and $SnO_2$; and the rest consisting of MnO. Consequently, the bead type noise filter can be fabricated inexpensively while it is adapted to suppress noises mainly by means of an R component in a safer and more reliable manner without distorting the waveform of transmission signals.

And, according to Claim 3 of the present invention, the magnetic core is formed of Mn—Zn ferrite which has a basic component composition comprising: 44.0 to 50.0 (50.0 excluded) mol % $Fe_2O_3$; 4.0 to 26.5 mol % ZnO; 0.1 to 8.0 mol % at least one of $TiO_2$ and $SnO_2$; 0.1 to 16.0 mol % CuO; and the rest consisting of MnO. Consequently, the bead type noise filter provided can be fabricated inexpensively while achieving high performance, as is the case with Claim 2.

BEST MODE FOR CARRYING OUT THE INVENTION

Preferred embodiments of the present invention will hereinafter be described with reference to FIGS. 1 to 6.

Figure 1:
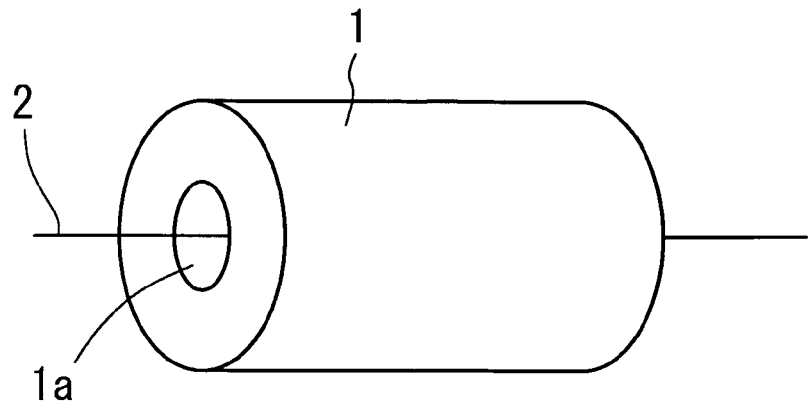
FIG. 1 is a perspective view of a bead type noise filter according to the present invention.
Figure 2:
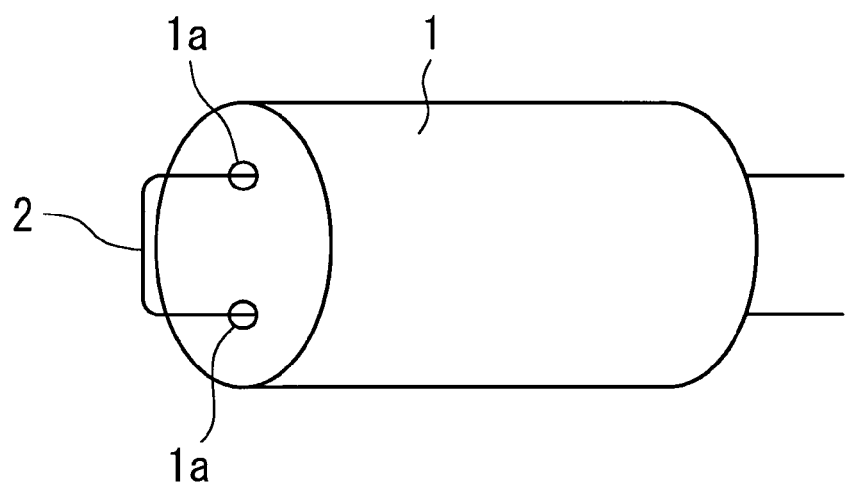
FIG. 2 is a perspective view of another bead type noise filter according to the present invention.

Referring to FIG. 1, a bead type noise filter is constituted by a magnetic core (bead core) 1 which is formed of a soft magnetic material having a high resistivity, and through which a signal line (or a power line) 2 is inserted. The magnetic core 1 is shaped cylindrical and has a through-hole 1a along its center axis, through which the signal line 2 passes. Referring to FIG. 2 showing another bead type noise filter, a magnetic core 1 is formed of the same material as the aforementioned magnetic core 1 shown in FIG. 1, shaped also cylindrical, but has two through-holes 1a, and a signal line 2 goes through one thereof and turns back so as to go through the other one.

Figure 3:
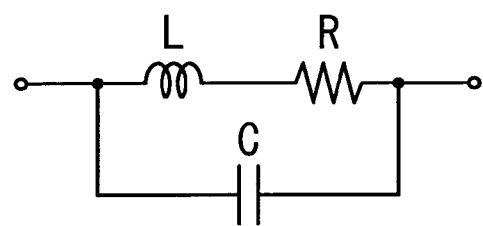
FIG. 3 shows an equivalent circuit of a bead type noise filter.

Referring to FIG. 3, an equivalent circuit of a bead type noise filter is represented such that a series circuit of an inductance L component and a resistance R component, and a capacitance C component are connected to each other in parallel.

The present invention is applied to a bead type noise filter which is shaped as shown in FIGS. 1 and 2, and which has an equivalent circuit as shown in FIG. 3.

Conventional general Mn—Zn ferrite containing 50.0 mol % or more $Fe_2O_3$ is inexpensive and exhibits a favorable characteristic, but has a very low resistivity. Therefore, a bead type noise filter with a magnetic core formed of such Mn—Zn ferrite cannot be used in a high frequency band, and is not allowed to get in touch a signal line without an insulating coat.

The present inventors, et al. disclosed in, for example, Japanese Patent Nos. 3108803 and 3108804 that Mn—Zn ferrite, when containing less than 50 mol % $Fe_2O_3$, and an appropriate amount of at least one of $TiO_2$ and $SnO_2$, has its resistivity significantly increased. However, the eventual object of the present invention, namely, realization of a high-performance bead type noise filter capable of suppressing noises mainly by means of an R component in a safe and reliable manner so as not to distort the waveform of transmission signals cannot be achieved simply by using a high resistivity ferrite like Ni—Zn ferrite. Specifically, since a magnetic core formed of Ni—Zn ferrite has its X-R cross point found at 10 MHz or higher which belongs to a high frequency band, as described later, a reactance X component still keeps increasing in a high frequency band. So, if a bead type noise filter constituted by such a magnetic core is attached on an input signal line of a high-impedance digital circuit, the waveform of the input digital signal is caused to undergo distortion, such as overshoot, ringing, and the like.

When an AC magnetic field is applied to a magnetic core of a bead type noise filter whose equivalent circuit is generally represented by FIG. 3, permittivity ϵ is expressed by a complex number as follows:

$$\epsilon = \sqrt{(\epsilon'^2 + \epsilon''^2)} \quad \text{Formula (3)}$$

where ϵ' is a real part of complex relative permittivity, and α" is an imaginary part thereof. The imaginary part ϵ" is a causative component for dielectric loss.

Since such a bead type noise filter is often attached on a signal line such that the signal line is inserted through a magnetic core (bead core) with one turn therearound (one turn insertion), and since a distance between input and output terminals is large, a capacitance C component between the winding (the signal line wound around the magnetic core) is small. A capacitance C component exists not only between the winding but also between the winding and the magnetic core, and therefore depends on the real part ϵ' of the complex relative permittivity of the magnetic core. For example, in case of Mn—Zn ferrite having a very large real part ϵ' of complex relative permittivity, a capacitance C component generated between the winding and the magnetic core is very large. Especially, since the winding of a bead type noise filter passes through the magnetic core in a close contact manner, a capacitance C component depends largely on the real part ϵ' of the complex relative permittivity of the magnetic core.

The present inventors, et al. produced bead type noise filters with Mn—Zn ferrites having same L components and R components, measured their impedance characteristics, and found out the following.

In conventional general Mn—Zn ferrite having a large real part ϵ' of complex relative permittivity (the C component is large), the X-R cross point is found toward a low frequency, but the impedance characteristic in a high frequency band is inferior. On the other hand, in Ni—Zn ferrite having a small real part ϵ' of complex relative permittivity (the C component is small), the X-R cross point is found toward a high frequency, but the impedance characteristic in a high frequency band is superior. Further, the real parts ϵ' of the complex relative permittivity of the conventional general Mn—Zn ferrite and the Ni—Zn ferrite are kept substantially constant, with less than single-digit variance if any, from a low frequency band through a high frequency band.

Based on the above finding, the present inventors, et al. came up with a bead type noise filter constituted by a magnetic core formed of a soft magnetic material which exhibits a characteristic that the real part ϵ' of complex relative permittivity varies very largely from a low frequency band through a high frequency band. In the bead type noise filter described above, the X-R cross point is found toward a low frequency band because the real part ϵ' of the complex relative permittivity is large to some extent in a lower frequency band, and the impedance characteristic is excellent in a high frequency band because the real part ϵ' of the complex relative permittivity is small in a high frequency.

According to the present invention, a magnetic core is set to have a resistivity of 150 Ωm or higher. There is no definitely telling whether a problem occurs or not when a copper wire with no insulating coat is wound directly on a magnetic core because it depends on a voltage applied, but a magnetic core having a resistivity of 150 Ωm or higher is supposed to duly work without problems in fairly extensive applications.

Also, in the present invention, a real part ϵ' of complex relative permittivity of a magnetic core is set to range between 1,000 and 20,000 at 1 kHz, and from 50 downward at 1 MHz. With such a magnetic core in which the real part ϵ' of complex relative permittivity varies significantly from a low frequency through a high frequency as described above, the X-R cross point in a bead type noise filter moves toward a lower frequency, for example 5 MHz.

Embodiments of bead type noise filters according to the present invention will hereinafter be described. The bead types noise filters are constituted by magnetic cores formed of soft magnetic materials which are arranged to have a real part of complex relative permittivity ranging from 1,000 up to 20,000 at 1 kHz, and from 50 downward at 1 MHz, and a resistivity of 150 Ωm or higher. Each of the magnetic cores has a through-hole so as to form a closed magnetic path, and is attached on a signal line such that the signal line passes through the through-hole.

EXAMPLES

Process 1

Table 1 below shows basic compositions on sample magnetic cores. Some of the magnetic cores are formed of soft magnetic materials according to the present invention, and the others are formed of conventional soft magnetic materials for comparison.

TABLE 1

| | Basic Composition (mol %) | | | | | | | |
|---|---|---|---|---|---|---|---|---|
| | $Fe_2O_3$ | MnO | ZnO | $TiO_2$ | $SnO_2$ | NiO | MgO | CuO |
| Sample 1 | 47.0 | 41.5 | 10.5 | 1.0 | — | — | — | — |
| Sample 2 | 47.0 | 40.5 | 10.5 | — | 0.5 | — | — | 1.5 |
| Sample 3 | 53.0 | 37.5 | 9.5 | — | — | — | — | — |

TABLE 1-continued

| | Basic Composition (mol %) | | | | | | | |
|---|---|---|---|---|---|---|---|---|
| | $Fe_2O_3$ | MnO | ZnO | $TiO_2$ | $SnO_2$ | NiO | MgO | CuO |
| Sample 4 | 48.5 | — | 31.5 | — | — | 15.0 | — | 5.0 |
| Sample 5 | 48.5 | 2.0 | 18.5 | — | — | — | 31.0 | — |

Referring to Table 1, five kinds of sample magnetic cores (Samples 1 to 5) were prepared. Material powders selected out of $Fe_2O_3$, ZnO, $TiO_2$, $SnO_2$, CuO, MnO, NiO, and MgO and pre-weighed for respective compositions shown in Table 1 were mixed by a ball mill to produce respective mixtures, and the respective mixtures were calcined at 900 degrees C. for 2 hours in the atmosphere. The respective mixtures calcined were pulverized by a ball mill into particles with a grain diameter averaging about 1.4 μm. Then, the respective mixtures pulverized were mixed with polyvinyl alcohol added, were granulated, and press-molded under a pressure of 80 MPa into respective green compacts each with a toroidal configuration. Green compacts intended for Samples 1 to 3 were sintered at 1,150 degrees C. for 3 hours in an atmosphere with its oxygen partial pressure controlled by pouring in nitrogen, while green compacts intended for Samples 4 and 5 were sintered at 1,150 degrees C. for 3 hours in the atmosphere.

Thus, Samples 1 to 5 with an outer diameter of 3.2 mm, an inner diameter of 1.6 mm, and a height of 6 mm were obtained. Samples (sample magnetic cores for bead type noise filters) 1 to 5 thus prepared were measured on: initial permeability μi at 0.1 MHz; saturation magnetic flux density Bs at 1,194 A/m; resistivity ρv (Ωm); and real parts ε' of complex relative permittivity at 1 kHz and 1 MHz, and the measurements are shown in Table 2 below.

TABLE 2

| | μi | Bs | ρv | ε' | |
|---|---|---|---|---|---|
| | (0.1 MHz) | (1194A/m) | [Ωm] | (1 kHz) | (1 MHz) |
| Sample 1 | 857 | 410 | $10^3$ | 12,320 | 32 |
| Sample 2 | 861 | 390 | $10^3$ | 10,970 | 28 |
| Sample 3 | 853 | 420 | $10^{-1}$ | 58,430 | 18,800 |
| Sample 4 | 864 | 370 | $10^4$ | 22 | 17 |
| Sample 5 | 487 | 250 | $10^4$ | 56 | 51 |

Sample 5 formed of Mg—Zn ferrite is low in initial permeability μi and saturation magnetic flux density Bs and therefore is not advantageous compared to Samples 1 to 4. Especially, since a bead type noise filter is required to be prevented from becoming magnetically saturated by a ripple current and a surge noise, Sample 5 with a low saturation magnetic flux density Bs must have an increased dimension.

Sample 3 formed of general Mn—Zn ferrite is favorable in initial permeability μi and saturation magnetic flux density Bs, but very low in resistivity ρv therefore hampering its usage in a high frequency band. Also, Sample 3 must not be in a direct contact with an uninsulated signal line, thus inevitably limiting its applications.

Sample 1 formed of an inventive Mn—Zn ferrite (according to Claim 2), Sample 2 formed of another inventive Mn—Zn ferrite (according to Claim 3), and Sample 4 formed of Ni—Zn ferrite have favorable initial permeability μi, saturation magnetic flux density Bs, and resistivity ρv.

Process 2

Each of Samples 1 to 5 (bead cores) obtained according to Process 1 described above was attached on a signal line as a bead type noise filter such that the signal line was inserted through the core with one turn therearound (one turn insertion). Examples thus prepared are shown in Table 3 below with X-R cross points measured.

TABLE 3

| | Magnetic Core | Signal Line Insertion | X-R Cross Point |
|---|---|---|---|
| Inventive Example 1 | Sample 1 | 1 Turn Insertion | 4.9 MHz |
| Inventive Example 2 | Sample 2 | 1 Turn Insertion | 4.7 MHz |
| Comparative Example 1 | Sample 3 | 1 Turn Insertion | — |
| Comparative Example 2 | Sample 4 | 1 Turn Insertion | 11 MHz |
| Comparative Example 3 | Sample 5 | 1 Turn Insertion | — |

Figure 4:
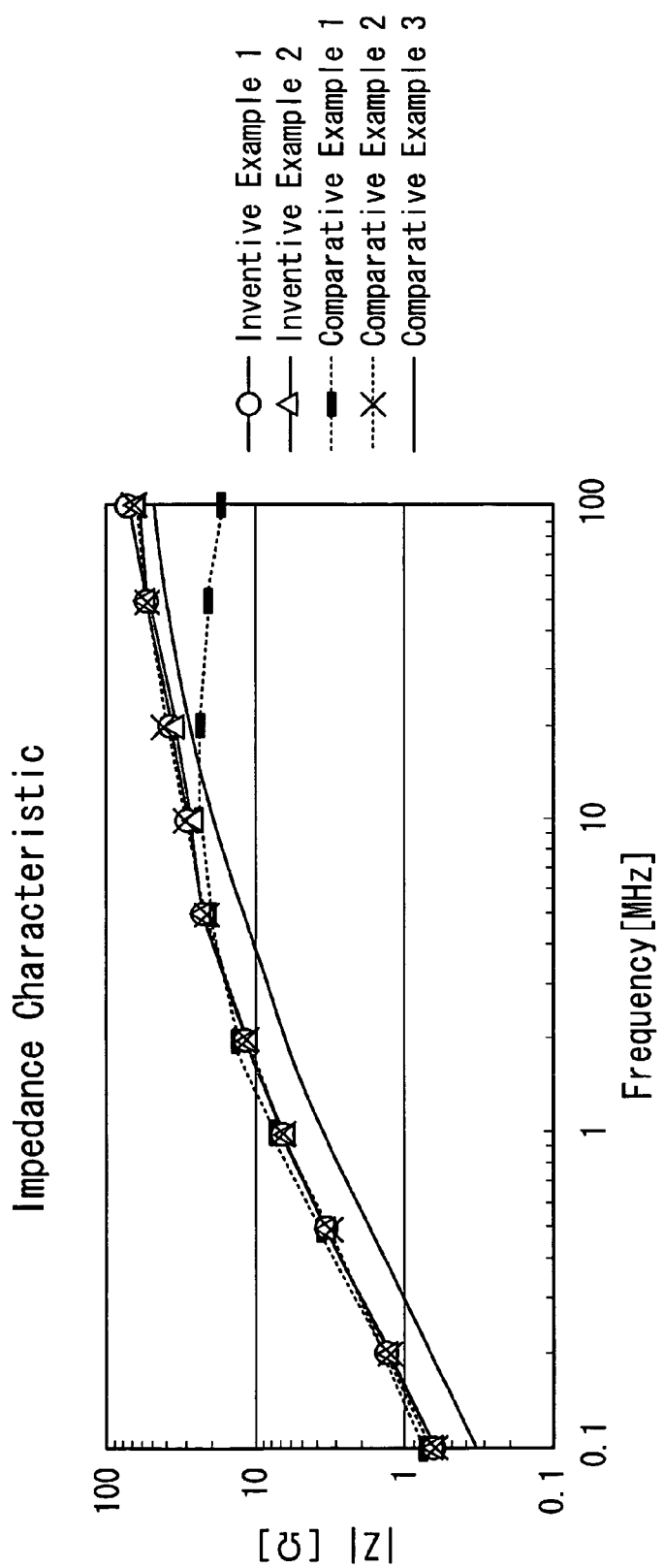
FIG. 4 is a graph showing measurements of frequency characteristics of impedance on bead type noise filters using sample magnetic cores shown in Table 1 to be presented later.

Measurements of frequency characteristics of impedance on Examples 1 to 5 are shown in FIG. 4. The impedance characteristics shown in FIG. 4 are practical characteristics as bead type noise filters.

As shown in FIG. 4, in a frequency from 10 MHz upward which is a crucial frequency band for noise suppression, Comparative Example 1 has its impedance characteristic significantly lowered compared to other examples (Inventive Examples 1 and 2, and Comparative Examples 2 and 3). This is because Mn—Zn ferrite has a low resistivity ρv.

Comparative Example 3 has a lower impedance characteristic than other examples (Inventive Examples 1 and 2, and Comparative Examples 1 and 2). This is because Mg—Zn ferrite has a low initial permeability μi.

Inventive Examples 1 and 2, and Comparative Example 2 have a favorable impedance characteristic in a high frequency band.

Inventive Examples 1 and 2, and Comparative Example 2, which, from the various measurement results in Processes 1 and 2 described above, looked like most promising candidates for bead type noise filters, were further examined.

Each of the impedances on Inventive Examples 1 and 2, and Comparative Example 2 measured in Process 2 was split into a reactance X component and a resistance R component according to Formula (1) described above. The component splits on Inventive Example 1 and Comparative Example 2 are shown graphically in FIGS. 5 and 6, respectively.

Figure 5:
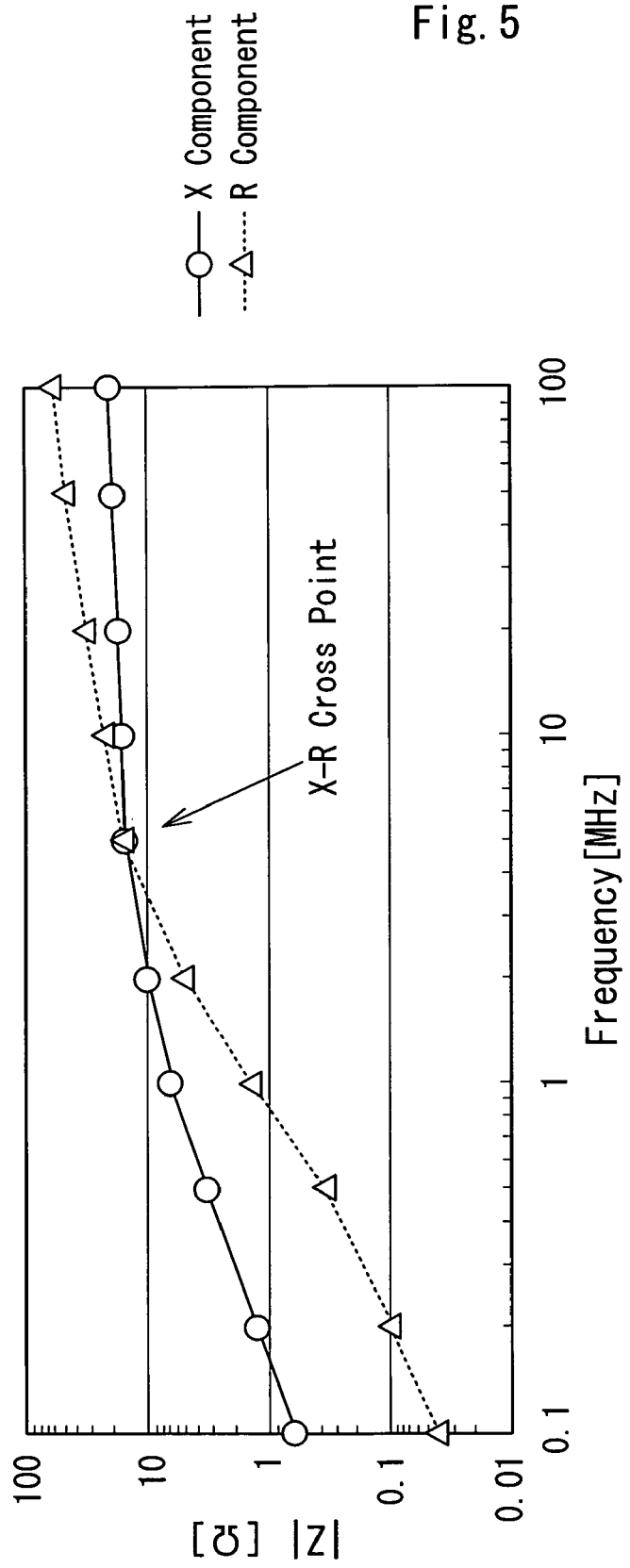
FIG. 5 is a graph showing measurements of frequency characteristics of impedance on Inventive Example 1 (a bead type noise filter using a magnetic core denoted by Sample 1)
Figure 6:
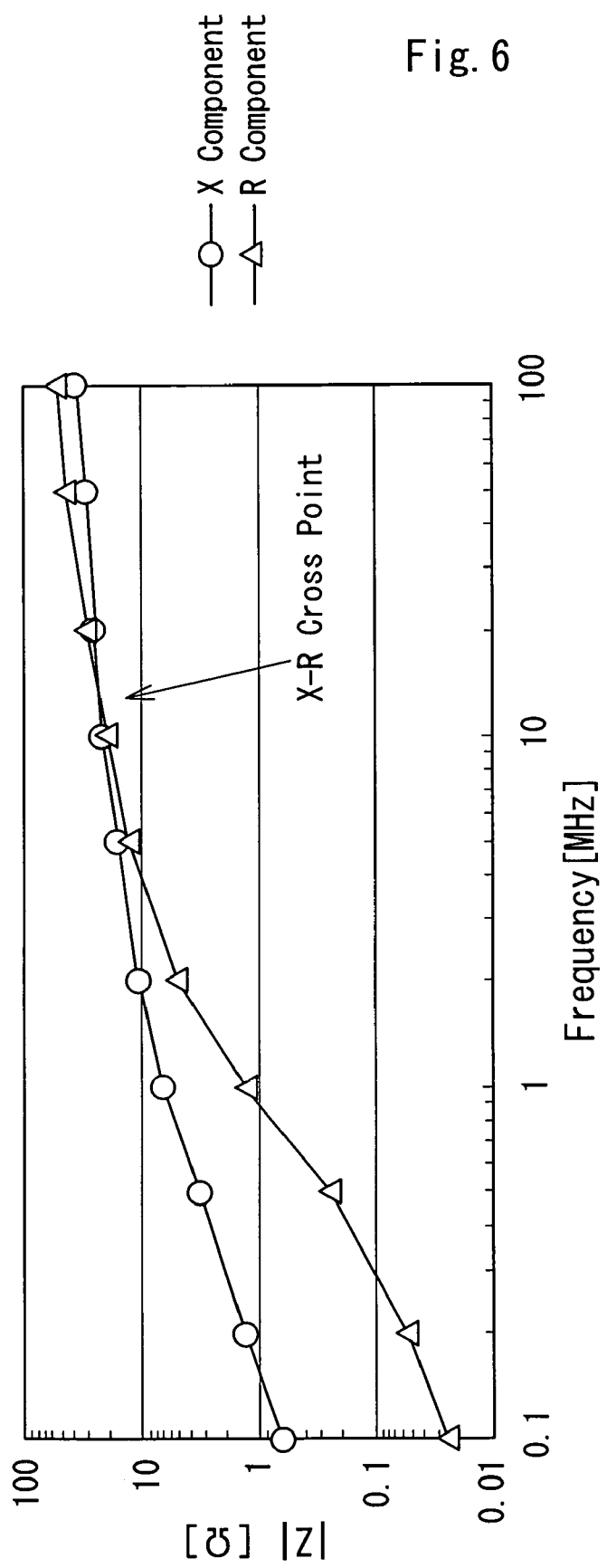
FIG. 6 is a graph showing measurements of frequency characteristics of impedance on Comparative Example 2 (a bead type noise filter using a magnetic core denoted by Sample 4).

Referring to FIG. 5, Inventive Example 1 has its X-R cross point found in the vicinity of 5 MHz. The component split on Inventive Example 2, which is not shown, turned out much the same as with Inventive Example 1. On the other hand, Comparative Example 2 has its X-R cross point found in the vicinity of 10 MHz as shown in FIG. 6. This is because, as shown in Table 2, the real part ε' of complex relative permittivity on Sample 1 (Inventive Example 1) and Sample 2 (Inventive Example 2) varies greatly between 1 kHz and 1 MHz while that on Sample 4 (Comparative Example 2) varies little.

The above finding from the examination has shown that though both Inventive Examples 1 and 2, and Comparative Example 2 have a satisfactory impedance characteristic in a high frequency band thus meaning an effective function of noise suppression, Inventive Examples 1 and 2 are superior to Comparative Example 2 in providing by far less chance of distorting the waveform of an input digital signal.

In explaining Claim 1 of the present invention, the embodiment described above refers to the bead type noise filters which both have a resistivity of 150 Ωm or higher, and which respectively have a real part $\epsilon'$ of complex relative permittivity of 12,320 and 10,970 at 1 kHz, and 32 and 28 at 1 MHz (Inventive Examples 1 and 2), but it was verified that any bead type noise filters having its real part $\epsilon'$ of complex relative permittivity falling within the range specified in Claim 1 can achieve an effect equivalent or substantially equivalent to that of the embodiment described above.

In explaining Claim 2 of the present invention, the embodiment described above refers to the bead type noise filter whose magnetic core is formed of Mn—Zn ferrite having a basic component composition comprising: 47.0 mol % $Fe_2O_3$; 10.5 mol % ZnO; 1.0 mol % $TiO_2$; and the rest (41.5 mol %) consisting of MnO (Inventive Example 1), but it was verified that any bead type noise filters having its basic component composition falling within the range specified in Claim 2 can achieve an effect equivalent or substantially equivalent to that of the embodiment described above.

And, in explaining Claim 3 of the present invention, the embodiment described above refers to the bead type noise filter whose magnetic core is formed of Mn—Zn ferrite having a basic component composition comprising: 47.0 mol % $Fe_2O_3$; 10.5 mol % ZnO; 0.5 mol % $SnO_2$; 1.5 mol % CuO; and the rest (40.5 mol %) consisting of MnO (Inventive Example 2), but it was verified that any bead type noise filters having its basic component composition falling within the range specified in Claim 2 can achieve an effect equivalent or substantially equivalent to that of the embodiment described above.

INDUSTRIAL APPLICABILITY

A bead type noise filter according to the present invention is helpful in simply and inexpensively suppressing high frequency noises radiated from a signal line of recent electronic devices that are coming out with reduced dimension and enhanced performance, and especially is suited for suppressing noises without distorting the waveform of an input digital signal.

The invention claimed is:

1. A bead type noise filter which comprises a magnetic core having a through-hole so as to form a closed magnetic path, and which is attached on one of a signal wire and a power wire such that the wire passes through the closed magnetic path of the magnetic core, wherein the magnetic core is formed of a soft magnetic material which has a real part of complex relative permittivity ranging from 1,000 up to 20,000 at 1 kHz, and 50 or lower at 1 MHz, and which has a resistivity of 150 Ωm or higher, and wherein the magnetic core has an impedance composed of a reactance component and a resistance component, and a crossing frequency between a frequency characteristic of the reactance component and a frequency characteristic of the resistance component is less than 5 MHz.

2. The bead type noise filter according to claim 1, wherein the magnetic core is formed of Mn—Zn ferrite having a basic component composition comprising: 44.0 to 50.0 mol % of $Fe_2O_3$ where 50.0 mol % is not included; 4.0 to 26.5 mol % of ZnO; 0.1 to 8.0 mol % of at least one of $TiO_2$ and $SnO_2$; and the rest consisting of MnO.

3. The bead type noise filter according to claim 1, wherein the magnetic core is formed of Mn—Zn ferrite having a basic component composition comprising: 44.0 to 50.0 mol % of $Fe_2O_3$ where 50.0 mol % is not included; 4.0 to 26.5 mol % of ZnO; 0.1 to 8.0 mol % of at least one of $TiO_2$ and $SnO_2$; 0.1 to 16.0 mol % of CuO; and the rest consisting of MnO.

* * * * *